(12) United States Patent
Moto et al.

(10) Patent No.: US 8,073,030 B2
(45) Date of Patent: Dec. 6, 2011

(54) SHUNT DRIVER CIRCUIT FOR SEMICONDUCTOR LASER DIODE

(75) Inventors: Akihiro Moto, Yokohama (JP); Keiji Tanaka, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 40 days.

(21) Appl. No.: 12/508,045

(22) Filed: Jul. 23, 2009

(65) Prior Publication Data

US 2011/0019706 A1    Jan. 27, 2011

(51) Int. Cl.
*H01S 3/00* (2006.01)
(52) U.S. Cl. .................... 372/38.02; 372/38.07
(58) Field of Classification Search ............ 372/25, 372/29.01, 38.1, 38.02, 38.07; 250/362; 341/144
See application file for complete search history.

(56) References Cited

U.S. PATENT DOCUMENTS

| | | | | |
|---|---|---|---|---|
| 4,835,780 A | * | 5/1989 | Sugimura et al. | 372/29.01 |
| 5,191,589 A | * | 3/1993 | Amano et al. | 372/38.02 |
| 5,513,197 A | | 4/1996 | Koishi | |
| 7,071,670 B1 | * | 7/2006 | Hidri et al. | 323/313 |
| 2005/0270104 A1 | * | 12/2005 | Yamamoto | 330/293 |
| 2009/0238226 A1 | * | 9/2009 | Moto et al. | 372/38.02 |

* cited by examiner

*Primary Examiner* — Jessica Stultz
*Assistant Examiner* — Tuan Nguyen
(74) *Attorney, Agent, or Firm* — Venable LLP; Michael A. Sartori; Christopher Ma

(57) ABSTRACT

A driver circuit for the laser diode is disclosed. The driver circuit has the shunt configuration with a switching transistor connected in parallel to the laser diode to shunt the current flowing in the laser diode. In the present invention, the bias for the switching transistor is varied as the operating temperature of the laser diode. In addition, the gate bias for the switching transistor is compensated for the temperature dependence of the switching transistor.

10 Claims, 9 Drawing Sheets

SHUNT DRIVER CIRCUIT FOR SEMICONDUCTOR LASER DIODE

BACKGROUND OF THE INVENTION

1. Field of the Invention

The present invention relates to a driver circuit for a semiconductor laser diode (hereafter denoted as LD), in particular, the inventions relates to a driver circuit with a shunt-driving configuration.

2. Related Background Art

The shunt driver for the LD has been well known as one type of the driver circuit. For instance, U.S. Pat. No. 5,513,197, has disclosed the laser driver circuit with the shunt-driving configuration. The shunt-driving configuration provides a switching transistor connected in parallel to the LD and shunts the bias current flowing in the LD by this switching transistor to modulate the LD. In a practical application for the LD such as an optical transmitter installed in the optical communication, two conditions are inevitable, that is, the average output power and the extinction ratio of the light emitted from the LD must be constant independent of both internal and external conditions. The LD installed within the optical transmitter shows large temperature dependence, that is, the threshold current increases and the slope efficiency decreases at a high temperature. Accordingly, an ordinary optical transmitted installs, what is called, the automatic power control (hereafter denoted as APC) to keep the output power and the extinction ration independent of the temperature. The APC circuit provides a larger bias current to the LD as the temperature thereof increases.

The shunt-driver circuit may adjust the bias current supplied to the LD and the amplitude of the driving signal for the switching transistor to keep the average power and the extinction ratio of the optical output from the LD independent of the temperature. Specifically, the shunt-driver circuit increases the bias current and the amplitude of the driving signal at a high temperature, while, the circuit decreases them at a lower temperature. However, a conventional shunt-driver circuit somewhat bounds the bias condition at a high temperature even in a low temperature; accordingly, unnecessary idle current is supplied to the LD or the switching transistor connected in parallel to the LD is left in a lower temperature, which becomes hard to reduce the power consumption.

SUMMARY OF THE INVENTION

A laser driver circuit of the present invention comprises: a current source to provide a bias current to the LD; a switching transistor connected in parallel to the LD to modulate the LD by shunting the bias current; and a bias generator to provide a bias to the switching transistor. A feature of the present invention is, in the driver circuit with the shunt-driver configuration, the bias provided to the switching transistor is varied as a temperature of the LD varies.

When the temperature of the LD is relatively low, the bias generator provides the bias with relatively smaller to the switching transistor, while, the temperature of the LD is high, the bias generator increases the bias to modulate the LD enough. Thus, because the bias for the switching transistor follows the change in the temperature of the LD, the total power consumption of the driver circuit may be reduced.

The laser driver of the present invention may provide a bias current detector to detect the bias current, which depends on the temperature of the LD. The bias generator may include a resistor and a reference generator. The resistor converts the bias current detected by the bias current detector into a voltage signal; and the bias generator outputs the bias whose magnitude is a sum of the voltage signal and the voltage of the reference generator. The voltage signal defines the range of the variation of the bias; while, the reference voltage sets the offset of the range. The bias current detector may be a current mirror circuit. The parallel circuit of the LD and the switching transistor is coupled with one of outputs of the current mirror circuits, while, the bias generator is coupled with the other output of the current mirror circuit.

Moreover, the driver circuit of the present invention may further provide the APC circuit to keep constant in the average power and the extinction ratio of the light output from the LD. The APC circuit may output a control signal to the bias current source to vary the bias current as the temperature of the LD changes. The bias current source, receiving the control signal from the ABC circuit, may vary the bias supplied to the switching transistor. Thus, the bias may be indirectly depends on the temperature of the LD.

The driver circuit of the present invention may further provide a pre-amplifier to output a driving signal to the switching transistor. The APC circuit may output another control signal to the pre-amplifier to vary the amplitude of the driving signal therefrom. The switching transistor receives the driving signal provided from the pre-amplifier superposed with the bias provided from the bias generator. Because both the driving signal and the bias indirectly follow the temperature of the LD through the APC circuit, the total power consumption of the driver circuit may be reduced.

BRIEF DESCRIPTION OF DRAWINGS

The foregoing objects and advantages of the present invention may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF PREFERRED EMBODIMENTS

Next, preferred embodiments according to the present invention will be described as referring to accompanying drawings. In the description of the drawings, the same elements will be referred by the same elements or symbols without overlapping explanations.

Figure 1:
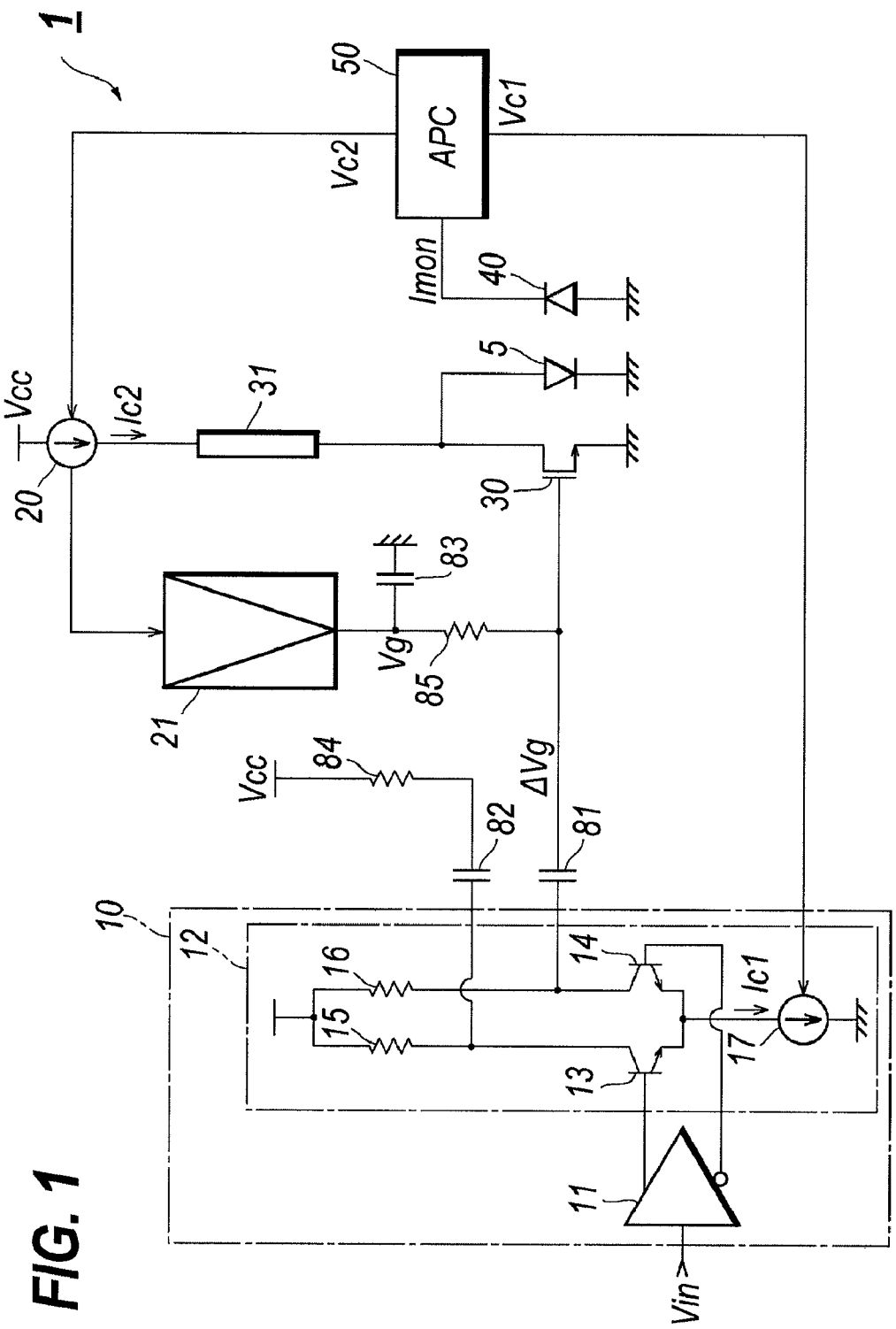
FIG. 1 is a circuit diagram of a laser driver according to the first embodiment of the invention.

FIG. 1 is a circuit diagram of a laser driver (hereafter denoted as LD-driver) according to an embodiment of the present invention. The LD driver 1, which electrically drives the semiconductor laser diode (hereafter denotes as LD) 5, comprises a pre-amplifier section 10, the bias current source 20, the switching transistor 30, the semiconductor photodiode (hereafter denoted as PD) 40, the auto-power control (APC) circuit 50, the current mirror circuit 60, the bias generator 70, capacitors, 81 to 83, and termination resistors, 84 and 85.

The pre-amplifier section 10, which generates the modulation signal Vm by receiving the input driving signal Vin, includes the pre-amplifier 11 and the differential circuit 12 connected downstream of the pre-amplifier 11. The pre-amplifier 11, by receiving the input driving signal Vin which is a mono-phase signal in the present embodiment, converts the mono-phase input signal into a differential signal that is output to the differential circuit 12. Although the present embodiment receives the mono-phase driving signal, the driver may receive the driving signal with the differential mode. The differential circuit 12 has a pair of transistors, 13 and 14, and a first current source 17. In the present embodiment shown in FIG. 1, the paired transistors, 13 and 14, are the npn-transistor whose base receives the differential signal from the pre-amplifier 11, the collector is coupled with respective load resistors, 15 and 16, and the emitter, which is commonly connected to each other, is coupled with the first current source 17. The first current source 17 generates the first current Ic1 whose magnitude is controlled by a first control signal Vc1 provided from the APC circuit 50. The paired transistors, 13 and 14, alternatively turns on/off in accordance with the output of the pre-amplifier 11 to switch the current Ic1 flowing in the load 15 or the other load 16. Thus, the magnitude of the modulation signal ΔVg depends on the resistance of the load 16 and the first current Ic1.

The second current source 20 is coupled with the anode of the LD 5 through the current mirror circuit 60. The second current Ic2, which is generated by the second current source 20 in accordance with the second control signal Vc2 provided from the APC circuit 50, is supplied to the anode of the LD 5 through the current mirror circuit 60.

The switching transistor 30 is an n-type MOSFET in the present embodiment and connected in parallel to the LD 5; specifically, the drain of the switching transistor 30 is connected with the anode of the LD 5 to receive the bias current Ic2, while, the source thereof is grounded, where the cathode of the LD 5 is also grounded. The gate of the transistor 30 receives the modulation signal Δvg output from the pre-amplifier section 10 through the coupling capacitor 81. Moreover, the gate of the switching transistor 30 is biased, through the termination resistor 85, with the bias voltage Vg generated by the bias generator 70. The bias voltage Vg is filtered by the bypassing capacitor 83 and the termination resistor 85. The switching transistor 30 is operated in accordance with the modulation signal ΔVg provided from the pre-amplifier section 10 through the coupling capacitor 81, shunts a portion of the second current Ic2; that is, when the transistor 30 is in the ON state, a greater portion of the second current Ic2 flows in the transistor 30, which sets the LD 5 in the OFF state; while, when the transistor 30 is in the OFF state, a greater portion of the second current Ic2 flows in the LD 5 as the bias current Ib for the LD, which makes the LD 5 in the ON state, thus, the LD 5 may be modulated with the modulation signal ΔVg.

A portion of the light emitted from the LD 5 enters the PD 40. The PD 40, whose anode is grounded, while, the cathode thereof is coupled with the APC circuit 50, generates the photocurrent Imon depending on the magnitude of the light emitted from the LD 5. This photocurrent Imon is provided to the APC circuit 50.

The APC circuit 50 generates two control signals, Vc1 and Vc2, each controlling the first current Ic1 and the second current Ic2. Specifically, the APC circuit 50 adjusts the first current Ic1 and the second current Ic2, by supplying respective control signals, Vc1 and Vc2, such that the photocurrent Imon is kept constant. The photocurrent Imon depends on the average optical power output from the LD 5; and the average optical power is substantially set in a midpoint of the optical power at ON state and that at OFF state of the LD 5. Moreover, the ON and OFF states are determined by the magnitude of the first current Ic1, that of the modulation signal ΔVg and the bias condition of the transistor 30; accordingly, the APC circuit 50 may keep the optical output power of the LD 5 in constant by adjusting two control signals, Vc1 and Vc2.

The LD 5 ordinary shows strong temperature dependence that the emission efficiency degrades as an operating temperature thereof increases. The APC circuit 50 may compensate this temperature dependence. Specifically, the APC circuit 50, monitoring the optical output power of the LD 5 through the PD 40, carries out the APC operation such that the average optical output power and the extinction ratio are kept constant by adjusting the first and second currents, Ic1 and Ic2, through the control signals, Vc1 and Vc2.

The bias generator 21, by receiving the second control signal Vc2 from the APC circuit 50, adjusts the bias voltage Vg applied to the gate of the switching transistor 30. As described later in this specification, the switching transistor 30 modulates the LD 5 by shunting the second current Ic2 provided from the second current source 20 thorough the inductor 31. However, the current necessary to keep constant in the average power and the extinction ratio strongly depends on the temperature of the LD 5. The amplitude of the current may be controlled through the first current Ic1 by the APC circuit 50, while, the average power depends on a condition how the switching transistor shunts the second current Ic2 when the driving signal ΔVg is in the low level.

Figure 2:
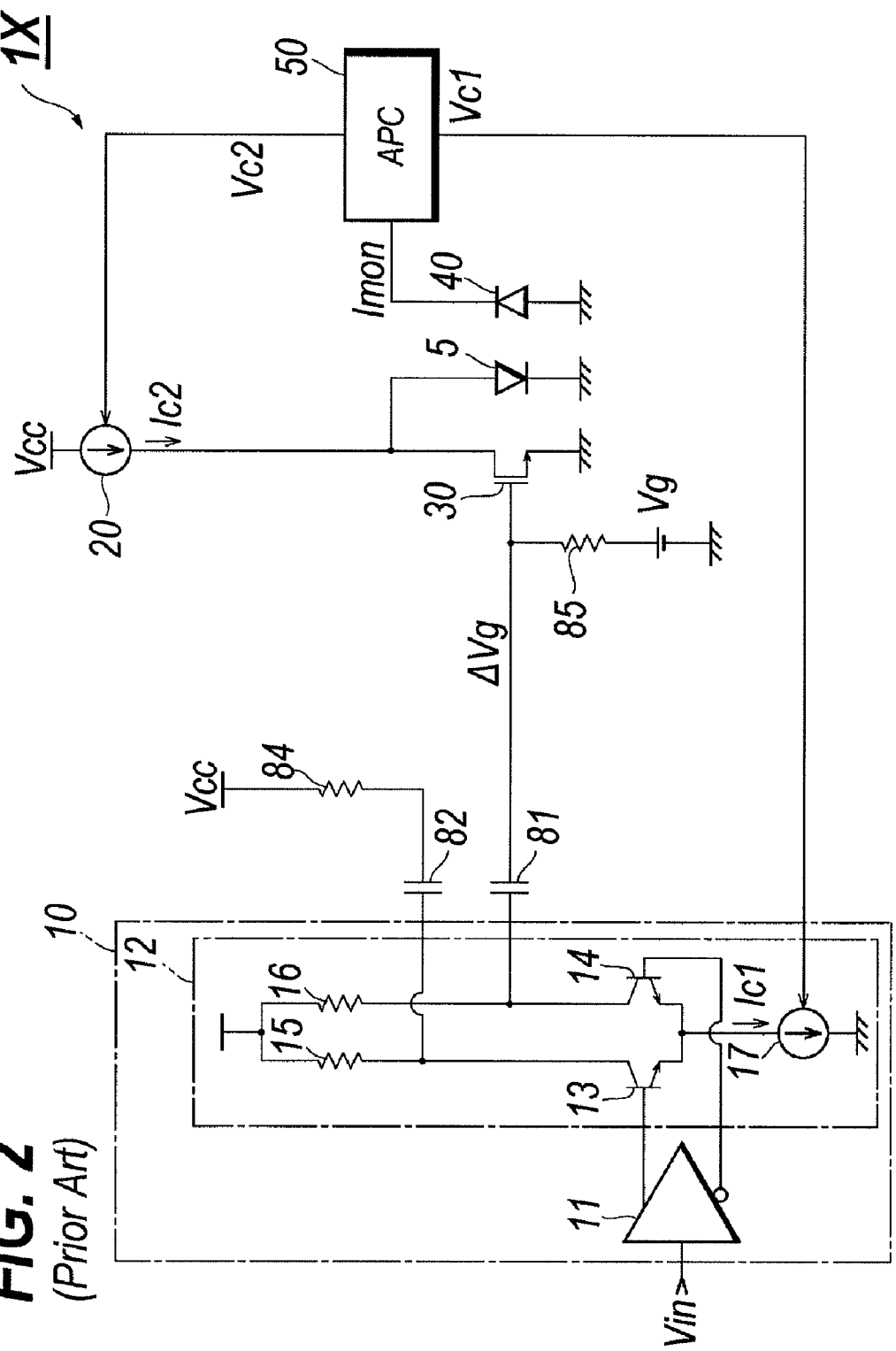
FIG. 2 is a circuit diagram of a laser driver having a conventional configuration.
Figure 3A:
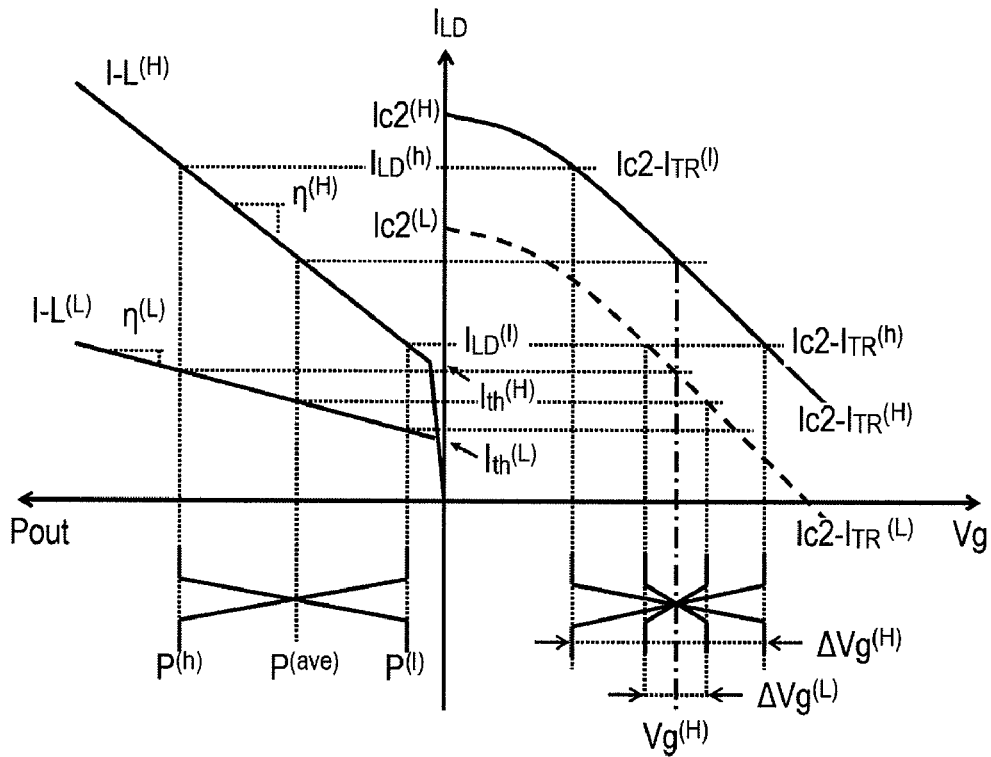
FIG. 3A explains a relation between the driving signal and the optical output power emitted from the laser diode in the conventional laser driver, and FIG. 3B explains the same relation for the laser driver with a configuration of the present invention.
Figure 3B:
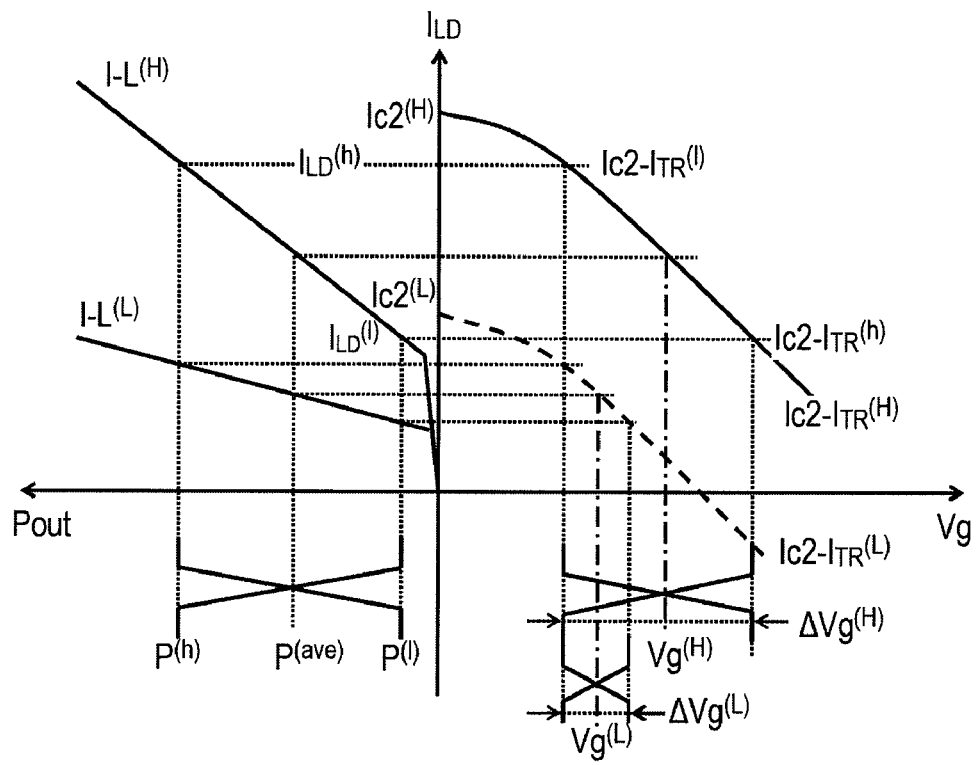

FIGS. 3A and 3B explain the function of the present LD driver 1 as comparing with an LD driver with a conventional configuration where the switching transistor is fixedly biased as shown in FIG. 2. In FIGS. 3A and 3B, the I-L characteristic corresponds to the optical output power (L) of the LD 5 when the LD is supplied with the current I; while, the Ids-Vgs characteristic corresponds to the drain current of the transistor 30 when the gate thereof is biased by the voltage Vg. The conventional LD driver 1X shown in FIG. 2 has the same configuration with that of the LD driver shown in FIG. 1 except that the conventional LD driver 1X omits the bias generator 21 and the switching transistor 30 is fixedly biased with the bias voltage Vg. This bias voltage Vg is invariant with respect to the temperature of the LD 5.

FIG. 3A, explains the operation of the LD 5 and the switching transistor 30 in the conventional LD driver 1X when the operating temperature of the LD is relatively high, for instance 85° C., and relatively low, for instance, at a room temperature, 27° C. The performance of the LD 5, in particular, the threshold current $I_{th}$ and the slope efficiency η thereof degrade as the temperature increases. Accordingly, a larger driving current is necessary at a high temperature to keep constant in the average optical power $P^{(ave)}$ and the extinction ratio $P^{(h)}/P^{(l)}$. The current flowing in the LD 5 is given by:

$$I_{LD}(h)=Ic2-I_{TR}(l),$$

$$I_{LD}(l)=Ic2-I_{TR}(h),$$

$$\Delta I_{LD}=I_{LD}(h)-I_{LD}(l)=I_{TR}(h)-I_{TR}(l)=\Delta I_{TR}$$

where $I_{LD}$ is the current flowing in the LD 5; while, $I_{TR}$ is the current flowing in the transistor 30. Parameters denoted by the symbol (h) correspond to the state in the HIGH level; while, those accompanied with the symbol (l) correspond to the state in the LOW level. Further, parameters attributed with the symbol (H) correspond to those at a high temperature, and those attributed with the symbol (L) correspond to parameters at a low temperature. Because the switching transistor 30 is the normally-off type, the current $I_{TR}$ flowing in the transistor 30 becomes small when the gate bias Vg is small, which increases the current $I_{LD}$ flowing in the LD 5, and saturates at $I_{LD}$=Ic2 where the whole current provided from the second current source 20 fully flows in the LD 5. On the other hand, as the gate bias Vg becomes larger, the current $I_{TR}$ flowing in the transistor 30 becomes large, which decreases the current $I_{LD}$ flowing in the LD 5.

As shown in FIG. 3A, because the performance of the LD 5 degrades at a relatively high temperature, a larger swing voltage $\Delta Vg^{(H)}$ is necessary, which is determined by the first current Ic1, to get the preset extinction ratio in the optical output of the LD 5. On the other hand, the swing voltage $\Delta Vg^{(L)}$ becomes comparably smaller at a lower temperature. However, the gate bias Vg, which determines the average driving current, is set such that the LOW level, Vg-$\Delta Vg^{(H)}$/2, is necessary to be biased in the linear region of the quadratic characteristics for the drain current of the switching transistor 30. In addition, the conventional driver 1X fixes this gate bias Vg determined at the high temperature. Therefore, even at the low temperature, the substantial idle current always flows in the transistor 30; this prevents the reduction of the power dissipation of the driver 1X.

On the other hand, the present driver circuit varies the gate bias Vg following the change in the operating temperature of the LD 5. Specifically, as the operating temperature becomes lower, the gate bias Vg also varies from $Vg^{(H)}$ to $Vg^{(L)}$, where $Vg^{(L)}<Vg^{(H)}$ such that the LOW level of the driving signal, which is Vg(H)-$\Delta$Vg(H)/2 for the high temperature and Vg(L)-$\Delta$Vg(L)/2 for the low temperature, is kept substantially constant independent of the temperature. As long as the LOW level of the driving signal applied to the gate of the transistor 30 is kept substantially constant and only the HIGH level changes following the operating temperature of the LD 5, which means that even the swing voltage $\Delta Vg$ of the driving signal varies as the temperature changes, the optical output of the LD 5, in particular, the average power and the extinction ratio thereof, may be reliably maintained. Thus, the driver circuit 1 of the present embodiment may effectively reduce the idle current that corresponds to the LOW level of the input driving signal, Vg-$\Delta$Vg/2.

Figure 4:
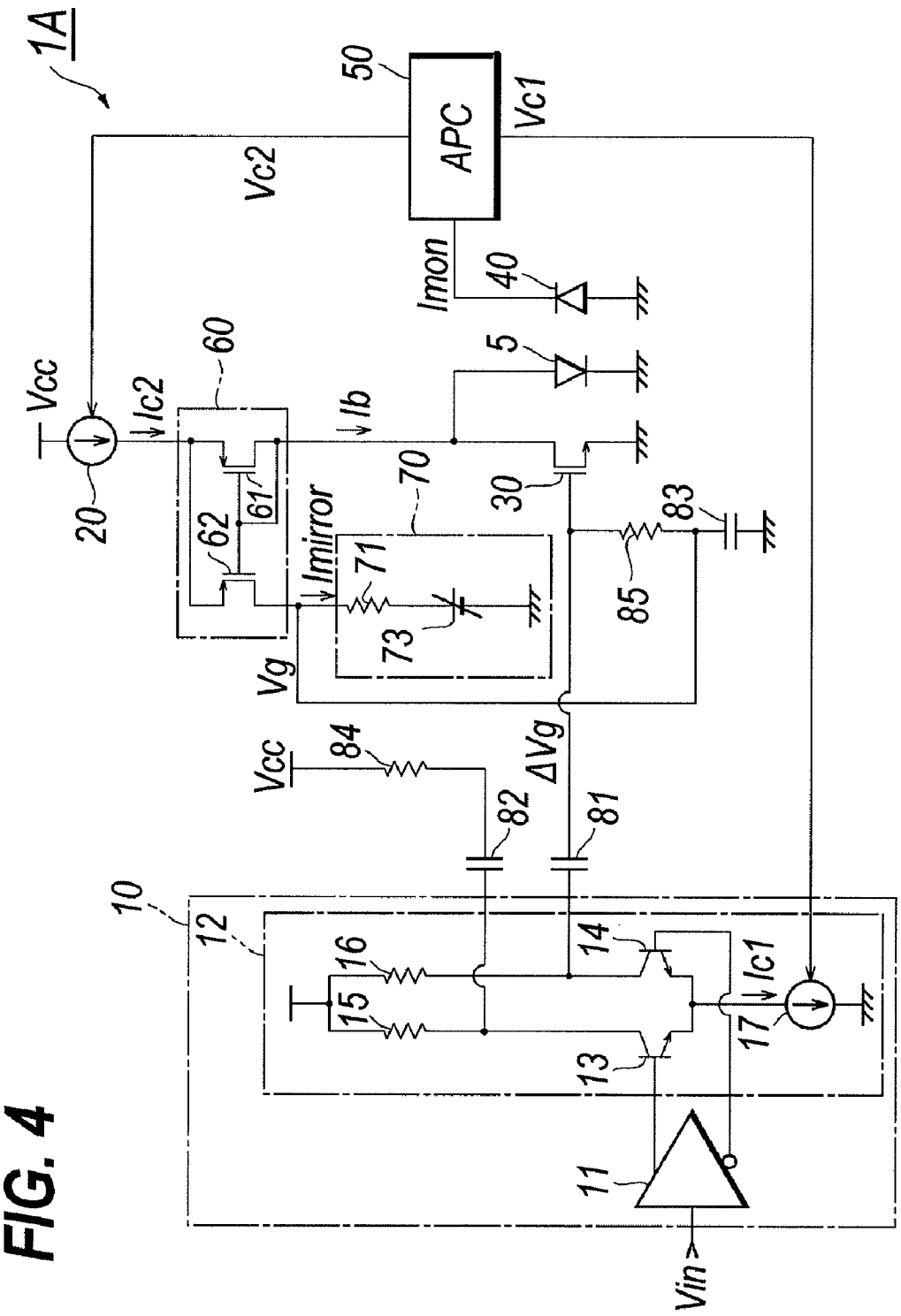
FIG. 4 is a circuit diagram of a laser driver according to the second embodiment of the present invention.

FIG. 4 illustrates a circuit diagram of the LD driver that configures with the gate bias generator 70 according to an embodiment of the invention and a current mirror circuit 60. The bias generator 70 includes a resistor 71 and a voltage source 73, while, the current mirror circuit 60, which is provided between the LD 5 and the second current source 20, includes two transistors, 61 and 62. These transistors, 61 and 62, in FIG. 4 are the p-MOSFET. The first transistor 61, connected between the parallel circuit of the LD 5 with the switching transistor 30 and the current source 20; while, the other transistor 62 is put between the bias generator 70 and the second current source 20. The current mirror circuit 60 divides the current Ic2 supplied from the second current source 20 into the bias current Ib provided to the parallel circuit of the LD 5 with the switching transistor 30 and the mirror current Imirror provided to the bias generator 70. The mirror current Imirror reflects the magnitude of the bias current Ib. That is, when the size of one transistor 62 coupled with the bias generator 21 is one hundredth of the size of the other transistor 61 coupled with the LD 5, the mirror current Imirror becomes one hundredth of the bias current Ib.

Figure 5:
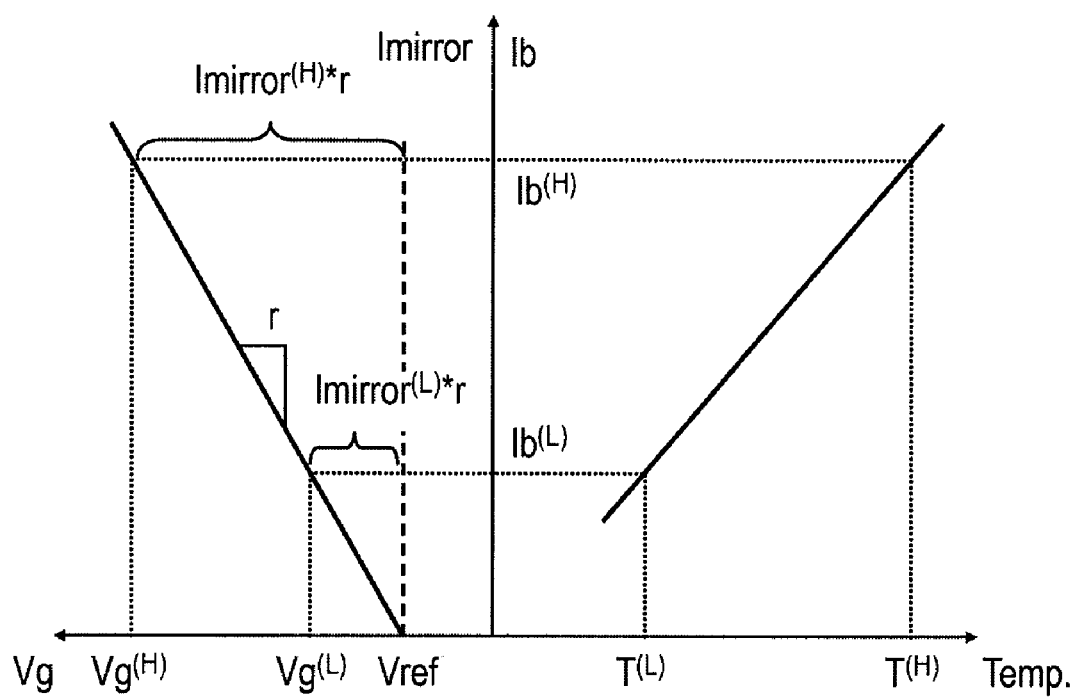
FIG. 5 explains a mechanism to vary the bias voltage of the switching transistor as the temperature varies.

The mirror current Imirror causes a voltage drop in the resistor 71, and the sum of the voltage source 73 and this voltage drop becomes the gate bias of the switching transistor 30. FIG. 5 schematically explains the mechanism to adjust the gate bias Vg. When the temperature of the LD 5 decreases from a high temperature $T^{(H)}$ to a lower temperature $T^{(L)}$, the APC circuit operates so as to decrease the bias current $Ib^{(H)}$ to $Ib^{(L)}$ and the mirror current Imirror, reflecting the change of the bias current Ib, also decreases. Then, a voltage drop caused by the resistor 71 also decreases from $Imirror^{(H)}$*r to $Imirror^{(L)}$*r, where r is the resistance of the resistor 71. Then, the bias voltage Vg applied to the switching transistor 30 decreases from $Vg^{(H)}$=Vref+$Imirror^{(H)}$*r to $Vg^{(L)}$=Vref+$Imirror^{(L)}$*r. Thus, selecting the reference voltage Vref of the voltage source 73 and the resistance r of the resistor 71, the gate bias Vg may be optionally controlled as the temperature changes.

Figure 6:
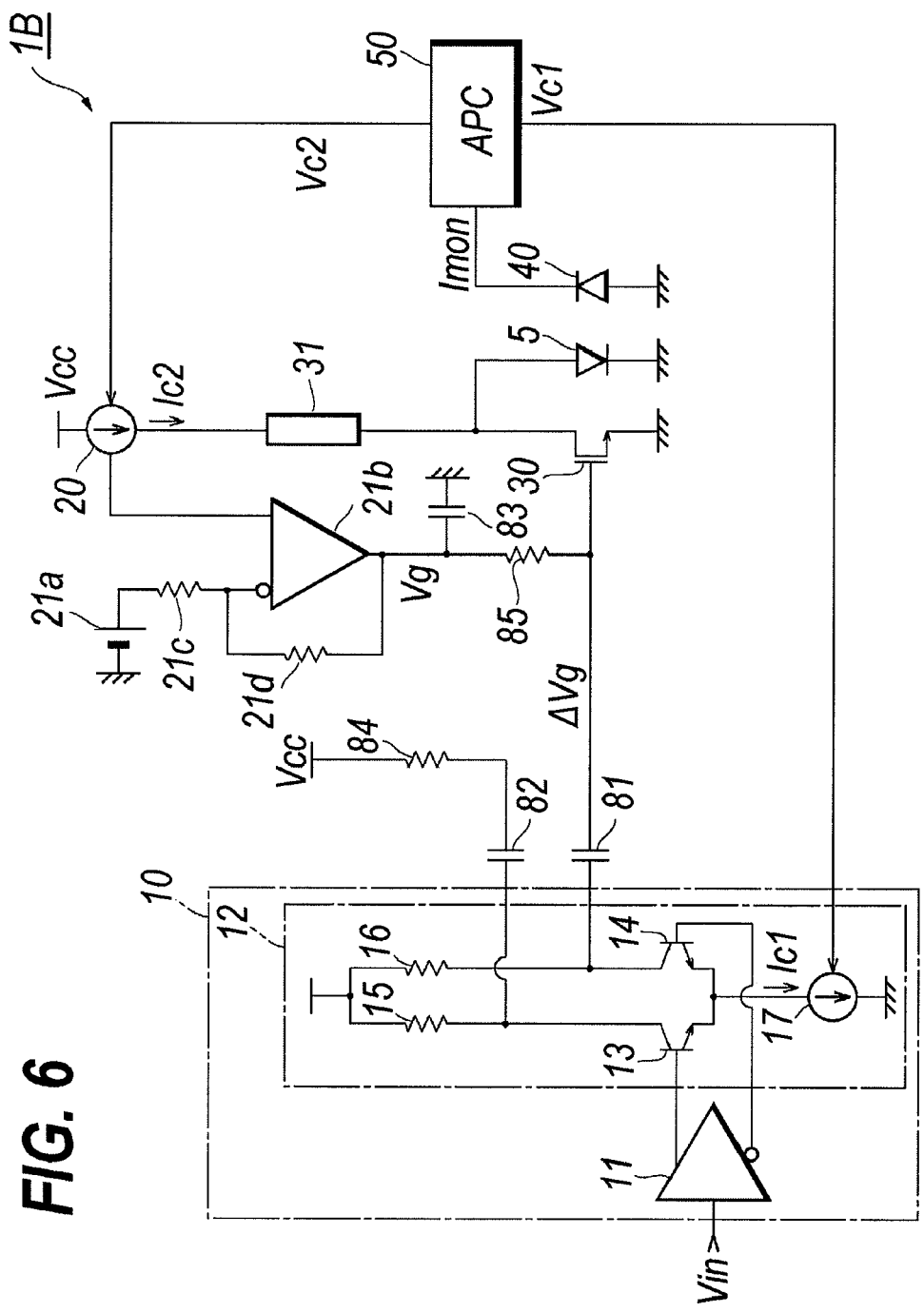
FIG. 6 is a circuit diagram of a laser driver according to the third embodiment of the present invention.

FIG. 6 shows another LD driver 1B according to the third embodiment of the present invention. This LD driver 1B provides another bias generator different from those shown in FIG. 4. The bias generator of this embodiment provides an operational amplifier 21b with the non-inverting arrangement and a reference 21a. The gain of the non-inverting amplifier 21b may be determined by the ratio of the resistance of two resistors, 21c and 21d, while, the output offset voltage may be substantially determined by the reference 21a. Accordingly, the bias generator of this embodiment replaces the resistor 71 to two resistors, 21c and 21d, and the voltage source 73 to the reference 21a. Because the LD driver 1B of this embodiment omits the current mirror circuit 60 that divides the second current Ic2 into two parts, one is the bias current Ib for the LD 5 and the other is the mirror current Imirror to generate the gate bias Vg depending on the temperature, the LD driver 1A shown in FIG. 4 is necessary to consume an additional power by the mirror current. On the other hand, the LD driver 1B of the present embodiment may omit the current mirror circuit 60 and no mirror current is necessary to generate the gate bias Vg. Moreover, because the bias generator of this embodiment is unnecessary to operate in a high speed, is necessary only to follow the change of the temperature of the LD 5, the operational amplifier 21b may be a type of the general purpose amplifier.

The bias generator shown in FIG. 6 has the non-inverting arrangement where the output thereof has the same phase to the input thereof. When the bias generator has the inverting arrangement of the operational amplifier 21b, that is, two resistors, 21c and 21d, are connected to the inverting input of the operational amplifier 21b; another type, the p-type, of the switching transistor 30 may be used. The operational amplifier 21b is configured to receive the second control signal Vc2 from the APC circuit 50 through the resistor 21c, to put the other resistor 21d between the output and the inverting input thereof, and to set the reference 21a in the non-inverting input thereof. When the APC circuit 50 decreases the second control signal Vc2 as the temperature decreases, the bias generator increases its output so as to decrease the current flowing in the transistor 30. Thus, the operation of the bias generator may be adequately carried out.

Figure 7:
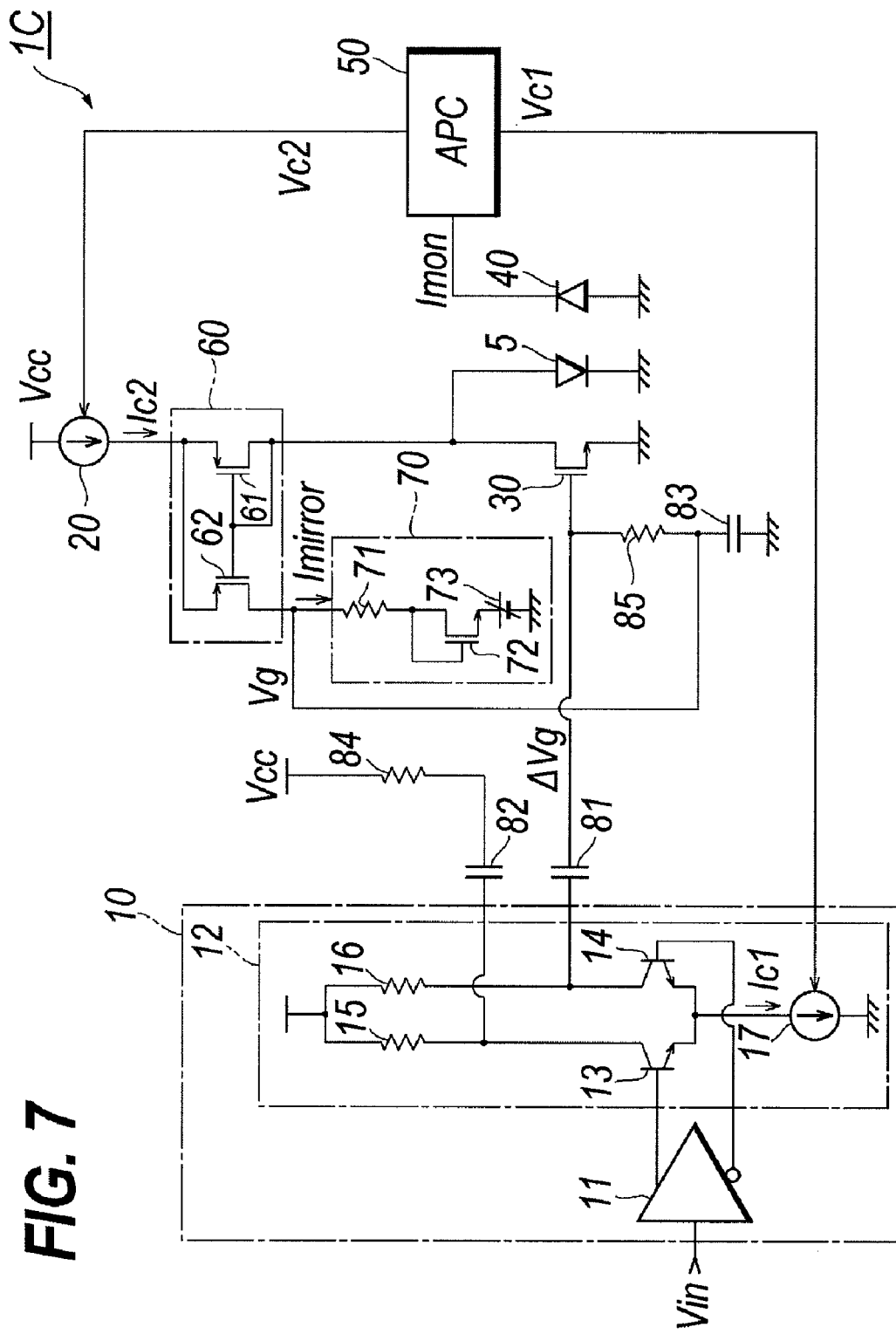
FIG. 7 is a circuit diagram of a laser driver according to the fourth embodiment of the present invention.

FIG. 7 is a circuit diagram of still another LD driver 1C according to an embodiment of the present invention, where this driver 1C modifies the aforementioned driver 1A shown in FIG. 4. The bias generator 70 of this driver 1C includes, in addition to the resistor 71 and the reference 73 in the driver LA, a transistor 72 whose gate is connected to the drain thereof which is called as the diode connection. In the analysis described above, the temperature dependence of the transistor 30 is ignored because it is enough smaller than that of the LD 5. However, the transistor 30 shows, although it is quite small, temperature dependence in the relation between the gate bias and the drain current. The additional transistor 72 configured with the diode connection, where the gate thereof is directly connected to the drain, may compensate this temperature dependence of the switching transistor 30.

Specifically, when the temperature of the LD 5 and that of the driver 1C increases, the forward voltage of the transistor 72 with the diode connection decreases, which decreases the gate bias Vg of the transistor 30. On the other hand, when the temperature decreases; the forward voltage of the transistor 72 increases, which also increases the gate bias of the switching transistor 30. Thus, the temperature dependence switching transistor 30 in the relation of the drain current with respect to the gate bias may be compensated. The gate bias Vg for the switching transistor 30 may be kept in the low level thereof in the position where the relation between the gate bias and the drain current shows the linear dependence, as illustrated in FIG. 3B.

Figure 8:
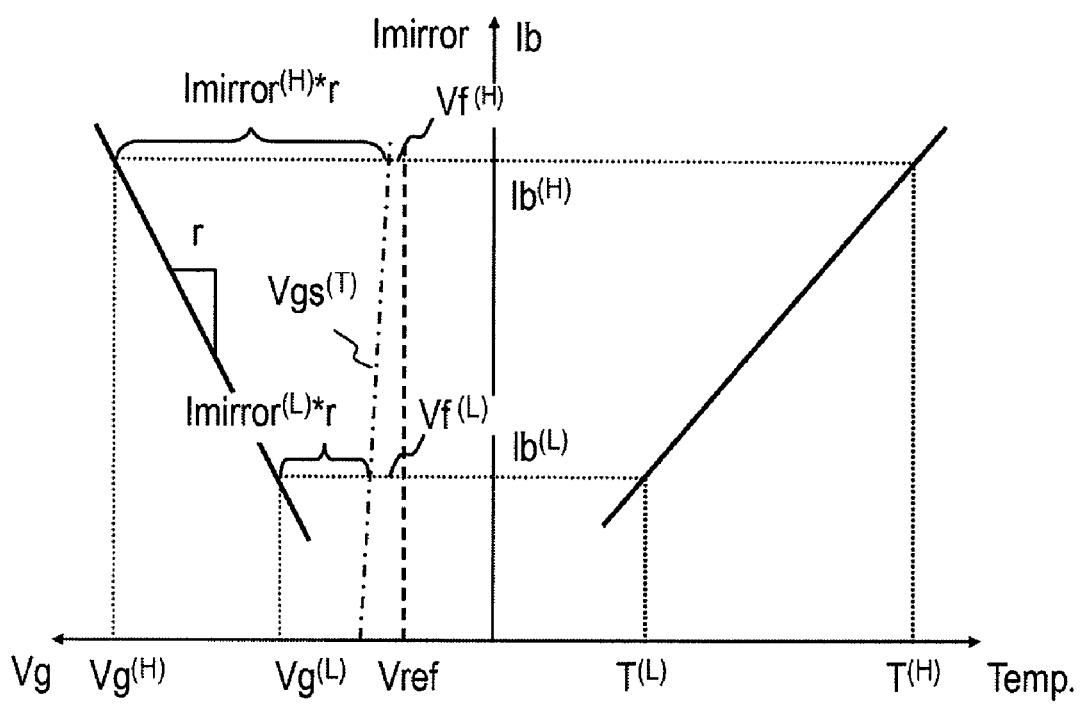
FIG. 8 explains how the temperature dependence of the switching transistor may be compensated.

FIG. 8 schematically explains a mechanism to adjust the gate bias Vg as compensating the temperature dependence of the transistor 30. When the temperature of the LD 5 decreases from a high temperature $T^{(H)}$ to a lower temperature $T^{(L)}$, the APC circuit 50 decreases the bias current from $Ib^{(H)}$ to $Ib^{(L)}$, which is reflected to the mirror current Imirror. Then, a voltage drop caused by the resistor 71 also decreases from $Imirror^{(H)}*r$ to $Imirror^{(L)}*r$, but the forward voltage of the transistor 72 increases from $Vf^{(H)}$ to $Vf^{(L)}$. Then, the gate bias $Vg^{(L)}$ is given by the sum of the reference voltage Vref, the forward voltage Vf of the transistor 72, and the voltage drop caused by the resistor 71:

$$Vg^{(L)}=Vref+Vf^{(L)}+Imirror^{(L)}*r.$$

Thus, the over compensation by the voltage drop of the resistor 71 may be corrected by the forward voltage of the transistor 72 with the diode connection.

Figure 9:
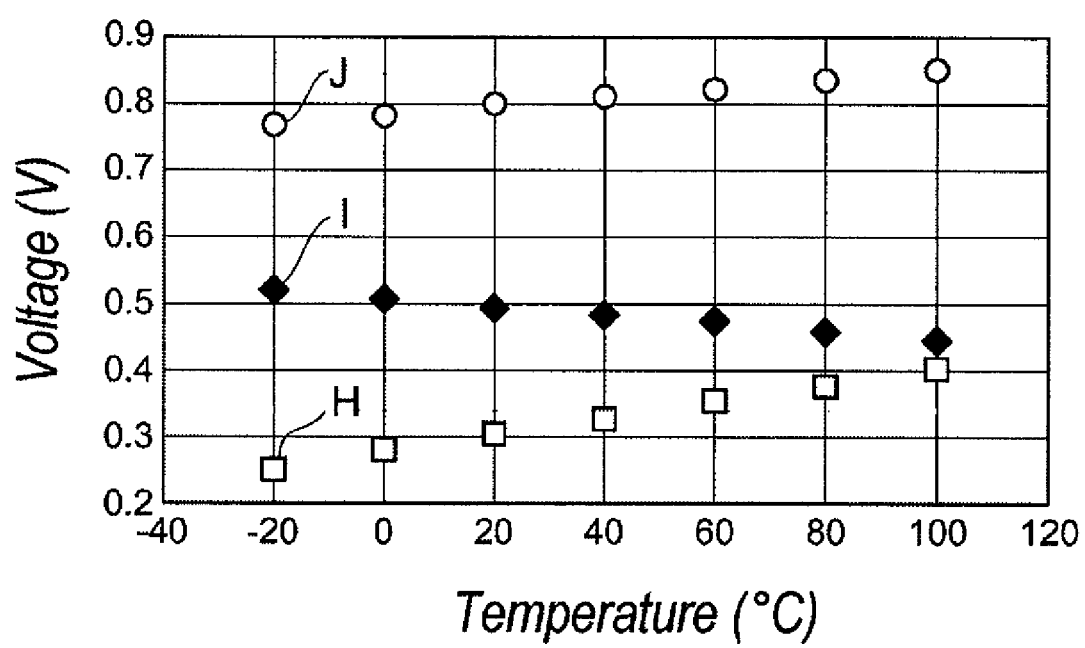
FIG. 9 illustrates a mechanism to correct the over compensation for the temperature dependence of the laser diode.

FIG. 9 shows an example of the correction of the over compensation of the bias generator shown in FIG. 7 by the transistor 72 with the diode connection. The behavior denoted by the symbol H corresponds to the voltage drop by the resistor 71, that illustrated by the symbol l corresponds to the forward voltage of the transistor 72 with the diode connection, and that shown by the symbol J is the gate bias Vg, which is substantially a sum of former two characteristics assuming that the reference voltage is independent of the temperature. The voltage drop by the resistor 71 shown in H enlarges as the temperature increases because the APC circuit operates so as to increase the second current Ic2 in higher temperatures to compensate the degradation of the performance in the LD 5. On the other hand, the forward voltage of the transistor 72 with the diode connection reduces at higher temperatures. Then, the sum of the voltage drop by the resistor 71 and the forward voltage of the transistor 72 is moderated compared with a case when the bias generator 20 includes only the resistor 71.

While there has been illustrated and described what are presently considered to be example embodiments of the present invention, it will be understood by those skilled in the art that other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

We claim:

1. A laser driver circuit for driving a semiconductor laser diode, comprising:
    a current source to provide a bias current to said laser diode;
    a switching transistor connected in parallel to said semiconductor laser diode, said switching transistor shunting said bias current provided from said current source;
    a bias generator to provide a bias to said switching transistor;
    an auto power control circuit for setting an average power and an extinction ratio of light output from said laser diode in constant independent of temperatures; and
    a pre-amplifier for outputting a driving signal to said switching transistor,
    wherein said bias is varied as a temperature of said laser diode varies,
    wherein said auto power control circuit outputs a first control signal and a second control signal, said first control signal being provided to said pre-amplifier to vary an amplitude of said driving signal, said second control signal being provided to said current source to vary said bias current supplied to said laser diode,
    wherein said driving signal superposed with said bias is provided to said switching transistor.

2. The laser driver circuit according to claim 1,
    further comprising a bias current detector configured to detect said bias current,
    wherein said bias generator includes a resistor and a reference generator, said resistor converting said bias current detected by said bias current detector into a voltage signal, said bias generator outputting a sum of said voltage signal and a reference voltage generated by said reference generator.

3. The laser driver circuit according to claim 2,
    wherein said bias generator further includes a transistor connected in series to said resistor, said transistor having a configuration of a diode connection.

4. The laser driver circuit according to claim 1,
    further comprising a current mirror circuit to detect said bias current supplied from said current source,
    wherein said laser diode connected in parallel to said switching transistor is connected in one of output of said current mirror circuit and said bias generator is connected in another output of said current mirror circuit.

5. The laser diode circuit according to claim 4,
    wherein said bias generator includes a resistor and a reference generator, said resistor converting a current output from said other output of said current mirror circuit into a voltage signal, said bias generator outputting a sum of said voltage signal and a reference voltage generated by said reference generator.

6. The laser driver circuit according to claim 5,
    wherein said bias generator further includes a transistor connected in series to said resistor, said transistor having a configuration of a diode connection.

7. The laser driver circuit according to claim 1,
    wherein said bias generator includes an operational amplifier and a reference generator, said operational amplifier having a gain corresponding to a range to vary said bias and said reference generator giving an offset to said bias.

8. The laser driver circuit according to claim 1,
    wherein said switching transistor is coupled with said pre-amplifier in an AC mode through a coupling capacitor.

9. The laser driver circuit according to claim 1,
wherein said bias is provided to said switching transistor through a termination resistor.

10. A laser driver circuit for driving a semiconductor laser diode, comprising:
- a current source to provide a bias current to said laser diode;
- a switching transistor connected in parallel to said semiconductor laser diode; said switching transistor shunting said bias current provided from said current source;
- a pre-amplifier for providing a modulation signal to said switching transistor, said pre-amplifier being coupled with said switching transistor in an AC mode through a coupling capacitor; and
- a bias generator coupled between said switching transistor and said coupling capacitor, said bias generator providing a bias to said switching transistor,
wherein said bias and said bias current vary such that a low level of said modulation signal is independent of a temperature of said laser diode.

* * * * *